(12) United States Patent
Aoki (10) Patent No.: US 7,781,762 B2
(45) Date of Patent: Aug. 24, 2010

(54) ORGANIC TRANSISTOR, METHOD FOR MANUFACTURING THE SAME, AND ELECTRONIC APPARATUS INCLUDING THE SAME

(75) Inventor: Takashi Aoki, Suwa (JP)

(73) Assignee: Seiko Epson Corporation (JP)

( * ) Notice: Subject to any disclaimer, the term of this patent is extended or adjusted under 35 U.S.C. 154(b) by 140 days.

(21) Appl. No.: 12/034,684

(22) Filed: Feb. 21, 2008

(65) Prior Publication Data

US 2008/0217609 A1 Sep. 11, 2008

(30) Foreign Application Priority Data

Mar. 7, 2007 (JP) .............................. 2007-056957

(51) Int. Cl.
*H01L 51/00* (2006.01)
*H01L 21/00* (2006.01)

(52) U.S. Cl. ................. 257/40; 257/347; 257/E51.001; 257/E21.001; 438/99

(58) Field of Classification Search .................. 257/40, 257/347, E51.001, E21.001, E21.412, E21.432; 438/99

See application file for complete search history.

(56) References Cited

U.S. PATENT DOCUMENTS

2006/0102894 A1* 5/2006 Masuda et al. ................ 257/40

FOREIGN PATENT DOCUMENTS

| JP | 2004-047566 | 2/2004 |
|---|---|---|
| JP | 2004-319982 | 3/2004 |
| JP | 2006-187706 | 7/2006 |

OTHER PUBLICATIONS

R. D. Deegan, et al.: Capillary Flow as the Cause of Ring Stains from Dried Liquid Drops; Nature 389, 827 (1997).

* cited by examiner

*Primary Examiner*—Victor A Mandala
*Assistant Examiner*—Whitney Moore
(74) *Attorney, Agent, or Firm*—Harness, Dickey & Pierce, P.L.C.

(57) ABSTRACT

An organic transistor includes a source electrode and a drain electrode, and an organic semiconductor layer disposed across between the source electrode and the drain electrode. The organic semiconductor layer includes a first semiconductor portion in a region where a gate electrode and the source electrode oppose each other, a second semiconductor portion in a region where the gate electrode and the drain electrode oppose each other, and a third semiconductor portion between the first semiconductor portion and the second semiconductor portion. The first semiconductor portion, the second semiconductor portion, and the third semiconductor portion satisfy the relationships $W1<W3$ and $W2<W3$, wherein $W1$ represents the average thickness of the first semiconductor portion, $W2$ represents the average thickness of the second semiconductor portion, and $W3$ represents the average thickness of the third semiconductor portion.

10 Claims, 4 Drawing Sheets

ORGANIC TRANSISTOR, METHOD FOR MANUFACTURING THE SAME, AND ELECTRONIC APPARATUS INCLUDING THE SAME

BACKGROUND

1. Technical Field

The present invention relates to an organic transistor, a method for manufacturing the organic transistor, and an electronic apparatus including the organic transistor.

2. Related Art

As an alternative to thin-film field-effect transistors made of an inorganic material, such as silicon, organic thin-film field-effect transistors (hereinafter referred to as organic transistors) made of an organic semiconductor have received attention because of the following advantages:

(1) Unlike the inorganic semiconductor, organic semiconductors can be made in an extremely low-temperature process. Accordingly, organic semiconductors allow the use of flexible substrates, such as plastic substrates and film substrates, and thus, can provide light-weight flexible, non-breakable devices.

(2) The use of organic semiconductors allow a simple, short-time process for manufacturing devices, such as applying a liquid or printing, accordingly greatly reducing the manufacturing cost and equipment cost.

(3) Organic semiconductors can be selected from a wide variation of materials, and the material properties and device characteristics can be easily and radically changed by modifying the molecule structure of the material. In addition, a combination of different functions of the material can provide new functions and devices that cannot be provided by use of inorganic semiconductors.

Examples of the related art include: Japanese Unexamined Patent Application Publication Nos. 2004-47566, 2006-187706, and 2004-319982.

Figure 5:
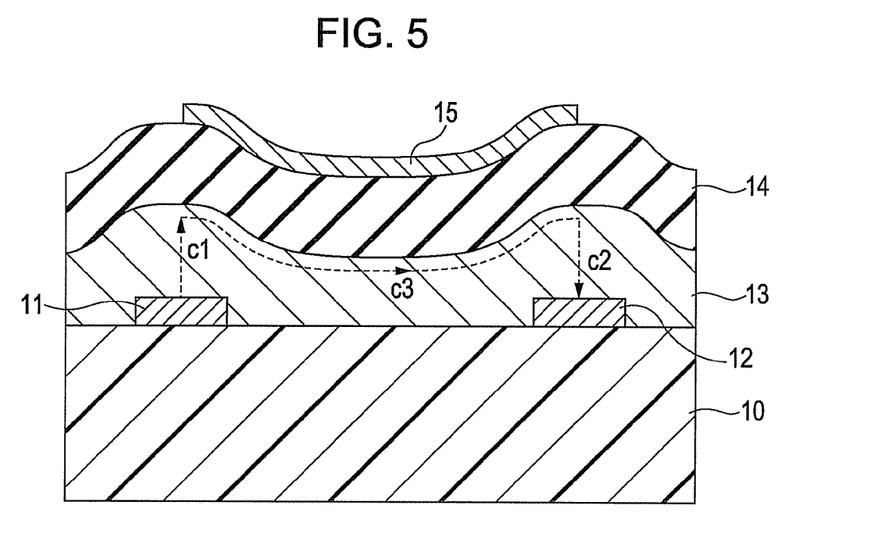
FIG. 5 is a schematic sectional view of a known organic transistor.

FIG. 5 shows a sectional view of a typical organic transistor. The organic transistor includes, on a substrate 10, a source electrode 11, a drain electrode 12, a semiconductor layer 13, a gate insulating layer 14, and a gate electrode 15. Arrow lines c1, c2, and c3 in the figure show the path through which carriers are conducted when the organic transistor is in an On state. In order to manufacture the organic transistor, the source electrode 11 and the drain electrode 12 are formed on the substrate 10, and then the semiconductor layer 13 is formed to an uniform thickness by, for example, spin coating. In addition, after coating the semiconductor layer 13 with the gate insulating layer 14, a gate electrode 15 is formed.

However, in such an organic transistor, the thickness of the semiconductor layer 13, which significantly influences the electrical characteristics, is difficult to control appropriately. It is accordingly difficult to obtain satisfying electric al characteristics. For example, the channel region (in which carriers are inducted, region corresponding to path c3) of an organic transistor is a small region having a thickness of about 1 to 5 nm in contact with the gate insulating layer 14. Accordingly, carriers first travel from the source electrode 11 to the channel region across an intrinsic semiconductor portion (path c1) having a high resistance, then through the channel region (path c3), and finally across another intrinsic semiconductor portion (path c2). If the semiconductor layer 13 has a large thickness, carriers have to travel through long paths of the intrinsic semiconductor portions (paths c1 and c2). Thus, the on-resistance of the organic transistor is increased.

On the other hand, an experiment has shown that it is preferable that the channel region have a large thickness. It is, in general, preferable that the channel region of a transistor made of an inorganic semiconductor have a small thickness because a large thickness of the channel region increases the number of traps in the layer. Unlike the inorganic semiconductor, it has been found that, in organic semiconductors, the channel region provides superior characteristics as the thickness is increased. Although the reason why a larger thickness leads to the superior effect is not clear, it may be because the interface between the semiconductor layer 13 and the gate insulating layer 14 is not easily affected by the underlying roughness, or a solid charge or trap level produced in the interface between the semiconductor layer 13 and its underlying layer (substrate 10 in FIG. 5)

SUMMARY

An advantage of some aspects of the invention is that it provides an organic transistor exhibiting a superior mobility, on/off ratio and threshold voltage and low-dispersion characteristics, and a method for manufacturing the organic transistor. Another advantage of the invention is that it provides an electronic apparatus including the organic transistor, exhibiting superior electrical characteristics.

According to an aspect of the invention, an organic transistor is provided which includes a source electrode and a drain electrode, an organic semiconductor layer disposed across between the source electrode and the drain electrode, and a gate electrode opposing the source and drain electrodes with the organic semiconductor layer and an gate insulating layer therebetween. The organic semiconductor layer includes a first semiconductor portion in a region where the gate electrode and the source electrode oppose each other, a second semiconductor portion in a region where the gate electrode and the drain electrode oppose each other, and a third semiconductor portion between the first semiconductor portion and the second semiconductor portion. The first semiconductor portion, the second semiconductor portion, and the third semiconductor portion satisfy the relationships $W1<W3$ and $W2<W3$, wherein $W1$ represents the average thickness of the first semiconductor portion, $W2$ represents the average thickness of the second semiconductor portion, and $W3$ represents the average thickness of the third semiconductor portion. In this structure, the third portion of the organic semiconductor layer intended to be the channel region has a large thickness while the first semiconductor portion and second semiconductor portion that are to be electrically connected to the source electrode or the drain electrode have small thicknesses. Consequently, the organic transistor can exhibit a superior mobility, on/off ratio and threshold voltage, and low-dispersion electrical characteristics.

Preferably, the source electrode, the drain electrode, and the organic semiconductor layer satisfy the relationships $W4<W3$ and $W5<W3$, wherein $W4$ represents the average of the total thickness of the source electrode and the first semiconductor portion and $W5$ represents the average of the total thickness of the drain electrode and the second semiconductor portion. Preferably, $W1$, $W2$, and $W3$ satisfy the relationships $W1 \leq 50$ nm, $W2 \leq 50$ nm, and $50$ nm$<W3 \leq 200$ nm. Thus, an organic transistor having superior electrical characteristics can be achieved.

Preferably, only part of the source electrode opposes the gate electrode. Preferably, only part of the drain electrode opposes the gate electrode. Thus, the parasitic capacitance between the gate electrode and the source and drain electrodes can be reduced. In general, it is desired that the gate electrode be disposed so as not to overlap with the source electrode (and the drain electrode). In organic transistors, however, the gate electrode and the source electrode (and drain electrode) are often formed by an ink jet method, and such a technique may not allow sufficient alignment between those electrodes, in comparison with the general semiconductor techniques (for example, photolithography). In such a case, the parasitic capacitance can be reduced by reducing the areas in which the electrodes oppose each other as much as possible.

According to another aspect of the invention, a method for manufacturing an organic transistor is provided. The method includes: forming a source electrode and a drain electrode on a substrate; forming an organic semiconductor layer by applying a solution containing an organic semiconductor across between the source electrode and the drain electrode by an ink jet method and then drying the solution; forming a gate insulating layer on the organic semiconductor layer; and forming a gate electrode opposing the source electrode and the drain electrode on the gate insulating layer. In forming the organic semiconductor layer, the type of the solution, the conditions of the ink jet method, and the drying conditions are selected so that the resulting organic semiconductor layer satisfies the relationships $W1<W3$ and $W2<W3$, wherein $W1$ represents the average thickness of a first semiconductor portion of the organic semiconductor layer in a region where the gate electrode and the source electrode oppose each other, $W2$ represents the average thickness of a second semiconductor portion of the organic semiconductor layer in a region where the gate electrode and the drain electrode oppose each other, and $W3$ represents the average thickness of a third semiconductor portion of the organic semiconductor layer between the first semiconductor portion and the second semiconductor portion. This method forms the semiconductor layer in such a manner that the third semiconductor portion of the organic semiconductor layer intended to be the channel region has a large thickness while the first semiconductor portion and second semiconductor portion that are to be electrically connected to the source electrode or the drain electrode have small thicknesses. Consequently, the resulting organic transistor can exhibit a superior mobility, on/off ratio and threshold voltage, and low-dispersion electrical characteristics.

In this method, selecting the type of the solution, the conditions of the ink jet method, and the drying conditions means that the type (polarity, surface tension, viscosity, solute content, etc), ejection conditions (amount of applied solution, surface tension of the substrate, surface shape of the substrate, surface treatment of the substrate, contact angle of the solution with the substrate, etc), and drying conditions (process temperature, solvent atmosphere around the solution, pressure, drying technique, etc.) of the solution are set so that the cross sections of the first semiconductor portion, second semiconductor portion and third semiconductor portion of the organic semiconductor layer after drying satisfy the relationships $W1<W3$ and $W2<W3$. For example, the organic semiconductor layer having a rising middle portion can be formed by increasing the viscosity of the solution so as not to flow easily from the middle region to the outer region, or by filling the surroundings with the vapor of the solvent or selecting a solvent having a high boiling temperature so that the vaporization of the solvent can be limited in the outer region.

Preferably, the type of the solution, the conditions of the ink jet method, and the drying conditions are selected so that the resulting source electrode, drain electrode, and organic semiconductor layer satisfy the relationships $W4<W3$ and $W5<W3$, wherein $W4$ represents the average of the total thickness of the source electrode and the first semiconductor portion and $W5$ represents the average of the total thickness of the drain electrode and the second semiconductor portion. Thus, an organic transistor having superior electrical characteristics can be provided.

According to still another aspect of the invention, an electronic apparatus including the above-described organic transistor or an organic transistor manufactured by the above-described method is provided. The electronic apparatus can exhibit superior electrical characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

While the invention will be further described with reference to exemplary embodiments and the attached drawings, the invention will not be limited to the embodiments. The components or parts of the embodiments, including the shapes and combinations, will be illustrated as examples, and various modifications may be made without departing from the scope and spirit of the invention. For the sake of easy understanding, the structures shown in the drawings differ from actual structures in scale, number, and so forth.

Figure 1:
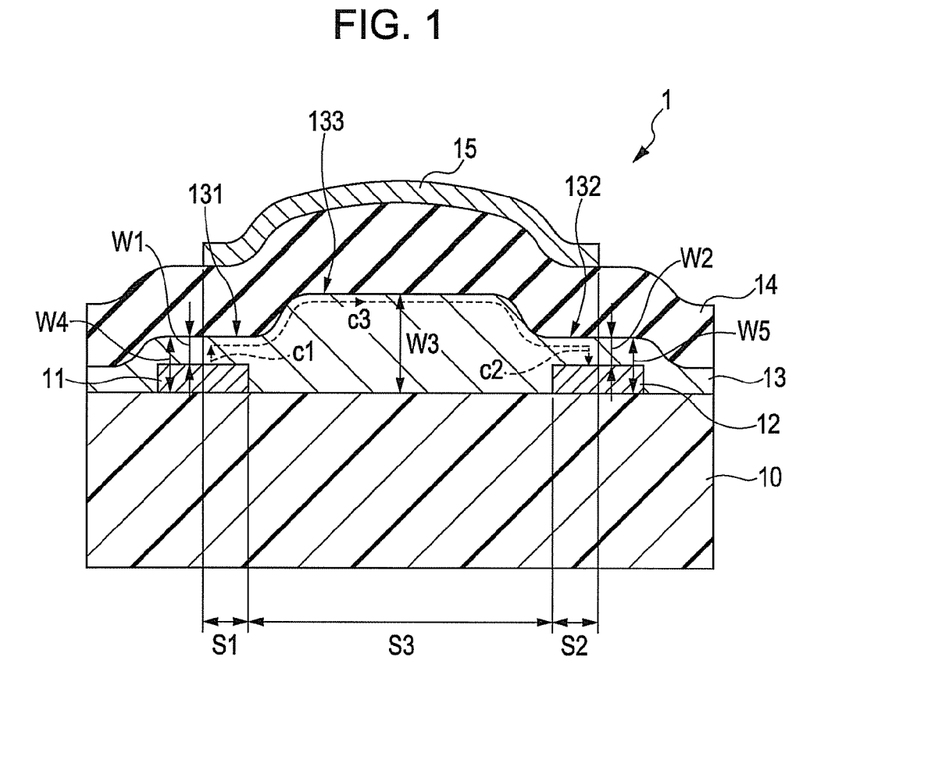
FIG. 1 is a schematic sectional view of an organic transistor according to an embodiment of the invention.

FIG. 1 is a schematic sectional view of an organic transistor 1 having a top gate structure according to an embodiment of the invention. The organic transistor 1 includes a semiconductor layer 13 made of an organic semiconductor, a gate electrode 15 opposing the semiconductor layer 13, an gate insulating layer 14 electrically insulating the gate electrode 15 from the semiconductor layer 13, and a source electrode 11 and a drain electrode 12, each partially opposing the gate electrode 15.

The substrate 10 of the organic transistor 1 can be arbitrarily selected from, for example, substrates of glass, silicon, metals such as aluminum and stainless steel, semiconductors such as GaAs, and plastics. Since the organic transistor can be manufactured by a simple, low-temperature process, a plastic substrate is preferably used because of its low price, lightweight, and flexibility.

The plastic substrate may be made of a thermoplastic resin or a thermosetting resin. Examples of such plastics include polyolefins such as polyethylene, polypropylene, ethylene-propylene copolymer and ethylene-vinyl acetate copolymer (EVA), cyclic polyolefin, modified polyolefin, polyvinyl chloride, polyvinylidene chloride, polystyrene, polyamide, polyimide, polyamide imide, polycarbonate, poly-(4-methylpentene-1), ionomer, acrylic resin, polymethyl methacrylate, acrylic-styrene copolymer (AS resin), butadiene-styrene copolymer, polyol copolymer (EVOH), polyesters such as polyethylene terephthalate, polybutylene terephthalate, polyethylene naphthalate and polycyclohexane terephthalate (PCT), polyether, polyether ketone, polyether ether ketone, polyether imide, polyacetal, polyphenylene oxide, modified polyphenylene oxide, polyacrylate, aromatic polyester (liquid crystal polymer), polytetrafluoroethylene, polyvinylidene fluoride, other fluorocarbon resins, styrene rubber, polyolefin rubber, polyvinyl chloride rubber, polyurethane rubber, fluorocarbon rubber, thermoplastic elastomers such as chlorinated polyethylene, epoxy resin, phenol resin, urea resin, melamine resin, unsaturated polyester, silicone resin, polyurethane, and copolymers, mixtures and polymer alloys of these materials. The substrate 10 is made of at least one of these materials, and may be a multilayer composite of these materials.

The source electrode 11 and the drain electrode 12 are disposed on the substrate 10. The source electrode 11 and the drain electrode 12 are made of an electroconductive material. Examples of the electrode material include metals, such as Cr, Al, Ta, Mo, Nb, Cu, Ag, Au, Pt, Pd, In, Ni, and Nd; alloys of these metals; electroconductive oxides, such as $InO_2$, $SnO_2$, and ITO; electroconductive polymers, such as polyaniline, polypyrrole, polythiophene, and polyacetylene; those electroconductive polymers containing an acid such as hydrochloric acid, sulfuric acid or sulfonic acid, a Lewis acid such as $PF_6$, $AsF_5$ or $FeCl_3$, a halogen such as iodine, a metal such as sodium or potassium, or any other dopant; and electroconductive composites in which carbon black or metal particles are dispersed.

The source electrode 11 and the drain electrode 12 are formed by etching an electroconductive layer made of such a material. Alternatively, the source electrode 11 and the drain electrode 12 may be formed in a pattern on the substrate 10 by vapor deposition through a metal-through mask having holes in a predetermined shape instead of etching. The electrodes may be made of a polymer mixture containing electroconductive particles, such as metal particles or graphite particles. If the electrode material is liquid, the electrodes can be more easily formed at a lower cost by patterning using the liquid, such as an ink jet method. The source electrode 11 and the drain electrode 12 may be made of different materials.

The thickness of the source electrode 11 and drain electrode 12 is preferably in the range of 10 nm to 10 µm, and more preferably in the range of 50 to 100 nm.

The source electrode 11 and the drain electrode 12 are covered with the semiconductor layer 13. The semiconductor layer 13 is made of an organic semiconductor. Examples of the organic semiconductor include semiconductor polymers, such as poly(3-alkylthiophene), poly(3-hexylthiophen) (P3HT), poly(3-octylthiophene), poly(2,5-thienylene vinylene) (PTV), poly(p-phenylene vinylene) (PPV), poly(9, 9-dioctylfluorene) (PFO), poly(9,9-dioctylfluorene-co-bis-N,N'-(4-methoxyphenyl)-bis-N,N'-phenyl-1,4-phenylenediamine) (PFMO), poly(9,9-dioctylfluorene-co-benzothiadiazole) (BT), fluorene-triallylamine copolymer, triallylamine polymer, and poly(9,9-dioctylfluorene-co-dithiophene) (F8T2) and other fluorene-bithiophene copolymers; and low-molecular weight organic semiconductors, such as $C_{60}$- or metal-phthalocyanine and its substituted derivatives, anthracene, tetracene, pentacene, hexacene and other acene molecule materials, and quarterthiophene (4T), sexithiophene (6T), octathiophene and other α-oligothiophenes. These organic semiconductors may be used singly or in combination.

The semiconductor layer 13 includes a first semiconductor portion 131 in a first region S1 where the gate electrode 15 and the source electrode 11 oppose each other, a second semiconductor portion 132 in a second region S2 where the gate electrode 15 and the drain electrode 12 oppose each other, and a third semiconductor portion 133 in a third region S3 between the first region S1 and the second region S2. Let the average thicknesses of the first semiconductor portion 131, the second semiconductor portion 132 and the third semiconductor portion 133 be W1, W2 and W3, respectively. W1, W2 and W3 satisfy the relationships W1<W3 and W2<W3. Let the average total thickness of the source electrode 11 and the first semiconductor portion 131 be W4, and let the average total thickness of the drain electrode 12 and the second semiconductor portion 132 be W5. W3, W4 and W5 satisfy the relationships W4<W3 and W5<W3.

The organic semiconductor can be formed into a layer by, but not limited to, vacuum vapor deposition, molecular beam epitaxial deposition, CVD, sputtering, plasma polymerization, electrolytic polymerization, chemical polymerization, ion plating, spin coating, casting, a crystal pulling method, Langmuir-Blodgett technique, spraying, an ink jet method, roll coating, bar coating, dispensing, a silk screen method, or dip coating. In order to form the semiconductor layer 13 having partially different thicknesses, for example, an organic semiconductor layer may be formed by those methods through a mask having patterned holes disposed appropriately on the substrate, or an organic semiconductor layer having a uniform thickness may be etched.

Preferably, the semiconductor layer 13 is formed by applying a solution of the material by an ink jet method or a dispensing method. These methods can easily control the thickness of the layer. For example, a document Capillary Flow as the Cause of Ring Stains from Dried Liquid Drops (R. D. Deegan, et al., Nature 389, 827 (1997)) discusses a phenomenon in which the solute in a solution is separated out around the solution applied, and increases the thickness around the applied solution. Consequently, the outer region has a larger thickness than the middle region. This is because the density of the vaporized solvent is lower in the outer region of the solution than the middle region and, accordingly, the solution in the outer region is more quickly dried. In this process, the solvent flows from the solution to the outer region so as to maintain the contact angle with the substrate constant. The solute is carried together with the solvent to the outer region and separated out, thus raising the outer region. On the other hand, when, the solution, for example, ink, has a high viscosity and is accordingly not easily flow from the middle region to the outer region, or when the vaporization of the solvent is limited because of the vapor of the solvent filling the outer region or the high boiling temperature of the solvent, the middle region can rise.

The above technique for forming such a layer is an example and the layer formed by applying a liquid and drying it can have a variety of profiles. The profile may depend on the polarity, boiling point, surface tension, viscosity and solute content of the liquid, the surface tension, surface shape and surface treatment of the substrate 10, and the contact angle of the solution with the substrate 10, the temperature in the process, the ambiance, pressure, drying conditions of the solvent around the liquid, and the amount of applied liquid. The liquid application can easily control these parameters, thus advantageously controlling the thickness of the semiconductor layer 13, unlike the vacuum vapor deposition in which the layer is evenly formed over the entire surface of the substrate.

The resulting third semiconductor portion 133 preferably has a thickness W3 in the range of 30 nm to 1 µm, and more preferably in the range of 50 to 200 nm. In addition, the first semiconductor portion 131 and the second semiconductor portion 132 preferably have thicknesses W1 and W2 of 200 nm or less, and more preferably 50 nm or less. The thicknesses W1, W2 and W3 of the first semiconductor portion 131, the second semiconductor portion 132, and the third semiconductor portion 133 are adjusted in a range satisfying the relationships W1<W3 and W2<W3. Furthermore, the total thickness W4 of the source electrode 11 and the first semiconductor portion 131 in the first region S1 and the total thickness W5 of the drain electrode 12 and the second semiconductor portion 132 in the second region S2 satisfy the relationship W4<W3 and W5<W3.

Before forming the semiconductor layer 13, the substrate 10 may be subjected to surface treatment for forming a favorable semiconductor layer 13. This surface treatment may be performed by using a surface modifier, such as hexamethyldisilazane, cyclohexene, or octadecyltrichlorosilane; organic washing using acetone, isopropyl alcohol, or the like; acid treatment using an acid, such as hydrochloric acid, sulfuric acid, or acetic acid; alkali treatment using sodium hydroxide, potassium hydroxide, calcium hydroxide, or ammonia; UV ozone treatment; fluorination; plasma treatment using oxygen or argon plasma or the like; or forming a Langmuir-Blodgett film. These techniques may be applied singly or in combination. The surface treatment may be performed on the entire surface of the substrate, or on part of the surface by patterning, for example, on only a region on which the semiconductor layer 13 is to be formed or only a region on which no semiconductor layer is to be formed. The surface treatment allows the semiconductor layer 13 to be more uniformly formed into a desired shape on the substrate 10, the source electrode 11, and the drain electrode 12, thereby further enhancing the electrical characteristics.

The semiconductor layer 13 is covered with the gate insulating layer 14. The gate insulating layer 14 can be formed of any insulating material without particular limitation irrespective of whether an organic material or an inorganic material is used. For example, the gate insulating layer 14 may be formed of an epoxy/polyester adhesive, epoxy/nitrile rubber adhesive, epoxy/acrylic elastomer adhesive or epoxy/urethane adhesive containing a curing agent, such as of amine, polyamide, acid or acid anhydride, imidazole, phenol resin, urea resin, melamine resin, or isocyanate; or an adhesive insulating material, such as emulsion adhesive, synthetic rubber adhesive, elastic adhesive, or modified acrylate adhesive, acrylic adhesive, or silicone adhesive, as long as the resulting organic transistor can properly operate. However, the gate insulating layer 14 largely influences the characteristics of the resulting organic transistor 1, and the material should be selected from the viewpoint of producing superior electrical characteristics. Exemplary materials of the gate insulating layer 14 that can generally produce superior electrical characteristics include organic materials, such as polymer films of polyvinyl phenol, polyimide, polystyrene, polyvinyl alcohol, polymethyl methacrylate and polyvinyl acetate, and parylene films; and inorganic materials, such as metal oxides including silicon oxide, silicon nitride, aluminium oxide and tantalum oxide, and metal composite oxides including barium strontium titanate and lead zirconium titanate. These materials may be used singly or in combination.

The gate electrode 15 is disposed on the gate insulating layer 14. The gate electrode 15 is formed so as to straddle between the source electrode 11 and the drain electrode 12. Part of the gate electrode 15 partially opposes the source electrode 11 and the drain electrode 12. Referring to FIG. 1, the region where the gate electrode 15 overlaps the source electrode 11 when viewed from above is the first region S1, and the region where the gate electrode 15 overlaps the drain electrode 12 when viewed from above is the second region S2. The region where the gate electrode 15 opposes the portion between the source electrode 11 and the drain electrode 12 is the third region S3.

Examples of the material of the gate electrode 15 include metals, such as Cr, Al, Ta, Mo, Nb, Cu, Ag, Au, Pt, Pd, In, Ni, Nd, and their alloys; electroconductive oxides, such as $InO_2$, $SnO_2$, and ITO; electroconductive polymers, such as polyaniline, polypyrrole, polythiophene, and polyacetylene; those electroconductive polymers containing an acid such as hydrochloric acid, sulfuric acid or sulfonic acid, a Lewis acid such as $PF_6$, $AsF_5$ or $FeCl_3$, a halogen such as iodine, a metal such as sodium or potassium, or any other dopant; and electroconductive composites in which carbon black or metal particles are dispersed.

The gate electrode 15 can be formed by etching an electroconductive layer made of such a material. Alternatively, the gate electrode 15 may be formed in a pattern on the gate insulating layer 14 by vapor deposition through a metal-through mask having holes in a predetermined shape instead of etching. The electrodes may be made of a polymer mixture containing electroconductive particles, such as metal particles or graphite particles. If the electrode material is liquid, the electrode can be more easily formed at a lower cost by patterning using the liquid, such as an ink jet method.

In the organic transistor 1 according to the present embodiment, as described above, the first semiconductor portion 131 and the second semiconductor portion 132 have lower thicknesses than the third semiconductor portion 133, which is intended to act as the channel region. Accordingly, the lengths of paths c1 and c2 running across the high-resistance intrinsic semiconductor portions, through which carriers travels, are reduced. In addition, the interface between the semiconductor layer 13 and the gate insulating layer 14 is not easily affected by the underlying roughness, or a solid charge or trap level produced in the interface between the semiconductor layer 13 and the substrate 10. Thus, the organic transistor of the present embodiment can exhibit a superior mobility, on/off ratio and threshold voltage, and low dispersion electrical characteristics.

Example

Method for Manufacturing the Organic Transistor

Figure 2A:
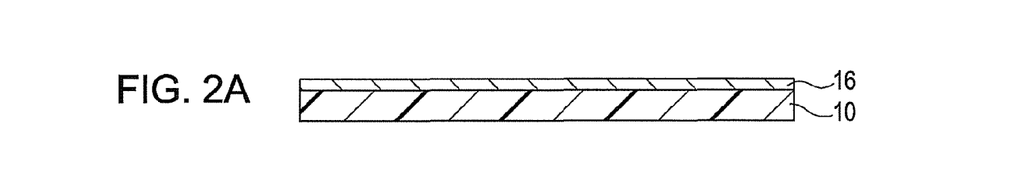
FIGS. 2A to 2F are representations of a method for manufacturing an organic transistor according to an embodiment of the invention.

FIGS. 2A to 2F are representations of the method for manufacturing an organic transistor of the Example of the invention. In the Example, first, a polyethylene naphthalate substrate 10 (Teonex Q65, produced by Teijin Dupont Films) was subjected to ultrasonic cleaning in isopropyl alcohol to degrease the surface. Then, a $SiO_2$ water barrier layer 16 was formed to a thickness of 200 nm on the substrate 10 by plasma CVD, as shown in FIG. 2A.

Figure 2B:
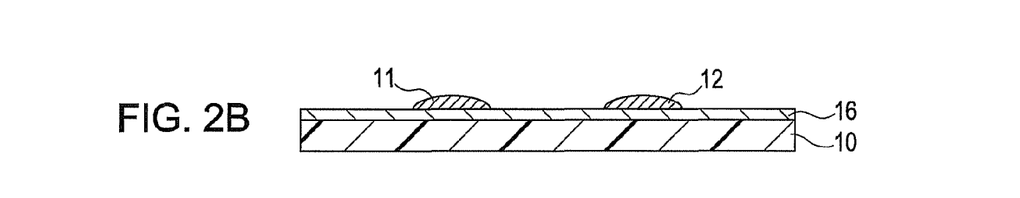

Turning to FIG. 2B, a dispersion (BAYTRON P) in which an electroconductive polymer, poly(3,4-oxyethyleneoxythiophene)/poly(styrene sulfonate) (PEDOT/PSS), is dispersed in isopropyl alcohol was applied in a pattern on the $SiO_2$ layer 16 by an ink jet method, thus forming a source electrode 11 and a drain electrode 12.

Figure 2C:
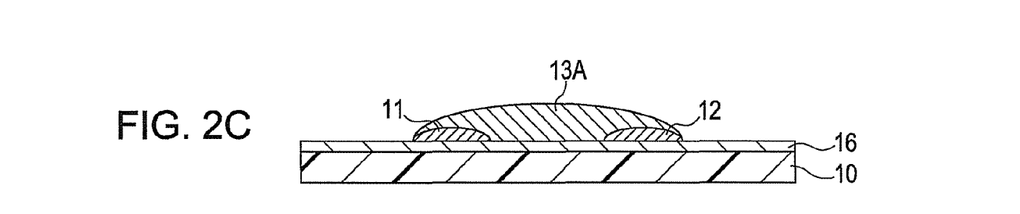
Figure 2D:
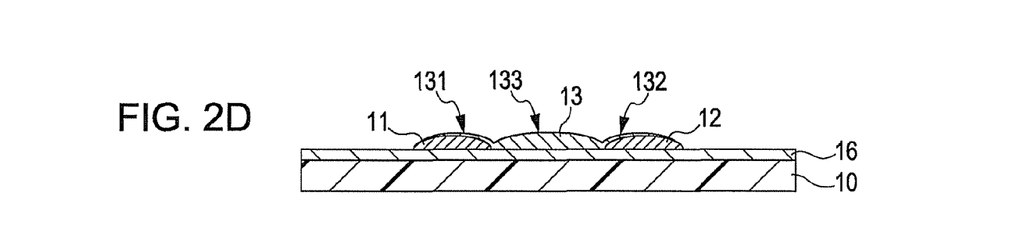

Turning to FIG. 2C, the substrate 10 was treated to be turned lyophilic in a UV ozone washer for 10 minutes. Poly(3-hexylthiophen) was dissolved at a concentration of 1.0% by weight in chlorobenzene. Five drops of the solution were ejected in a straight line at intervals of 50 μm onto the source electrode 11 and the drain electrode 12 by an ink jet application apparatus. Subsequently, the applied solution was dried to form a semiconductor layer 13, as shown in FIG. 2D.

Since chlorobenzene has a high boiling point, the liquid is hardly vaporized immediately after the application of the solution, consequently forming into a hemisphere 13A due to the surface tension, as shown in FIG. 2C. When the substrate 10 is heated, the solvent is dried and, simultaneously, the semiconductor material dissolved in the solution convects. Thus, the semiconductor layer 13 can be formed in such a manner that the middle portion rises with the outer portion having a smaller thickness, as shown in FIG. 2D. In order to form a layer in such a shape, the drying process should be precisely controlled. In the Example, the middle portion and the outer portion of the semiconductor layer 13 were controlled to thicknesses of 200 nm and 10 to 20 nm respectively by heating the substrate 10 at 80° C. for 30 minutes.

Figure 2E:
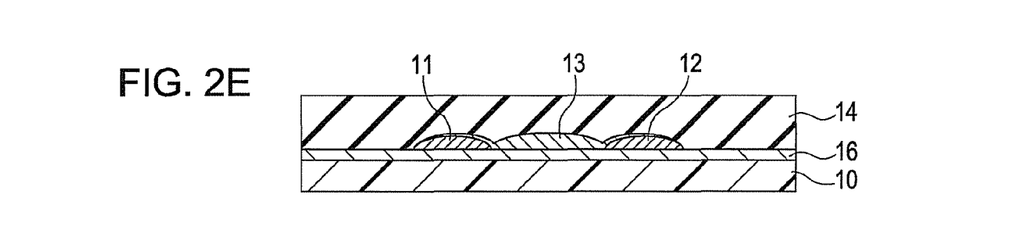

Turning to FIG. 2E, a polyimide solution was applied onto the substrate 10 by spin coating and then dried on a hot plate of 100° C. for 10 minutes, thus forming a 500 nm thick gate insulating layer 14 over the entire surface of the substrate.

Figure 2F:
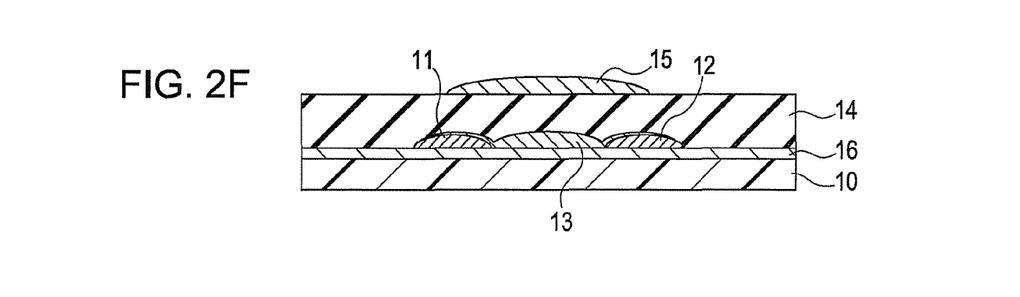

Finally, as shown in FIG. 2F, a gold particle dispersion in which gold particles having a diameter of 10 nm are dispersed in toluene (Perfect Gold (product name), produced by ULVAC Materials) for the gate electrode 15 was applied in a pattern by an ink jet method and then dried at 80° C. for 10 minutes. Wires were formed for the gate electrode and thus an organic transistor of the Example was completed.

Electrical Characteristics of Organic Transistor

Figure 3:
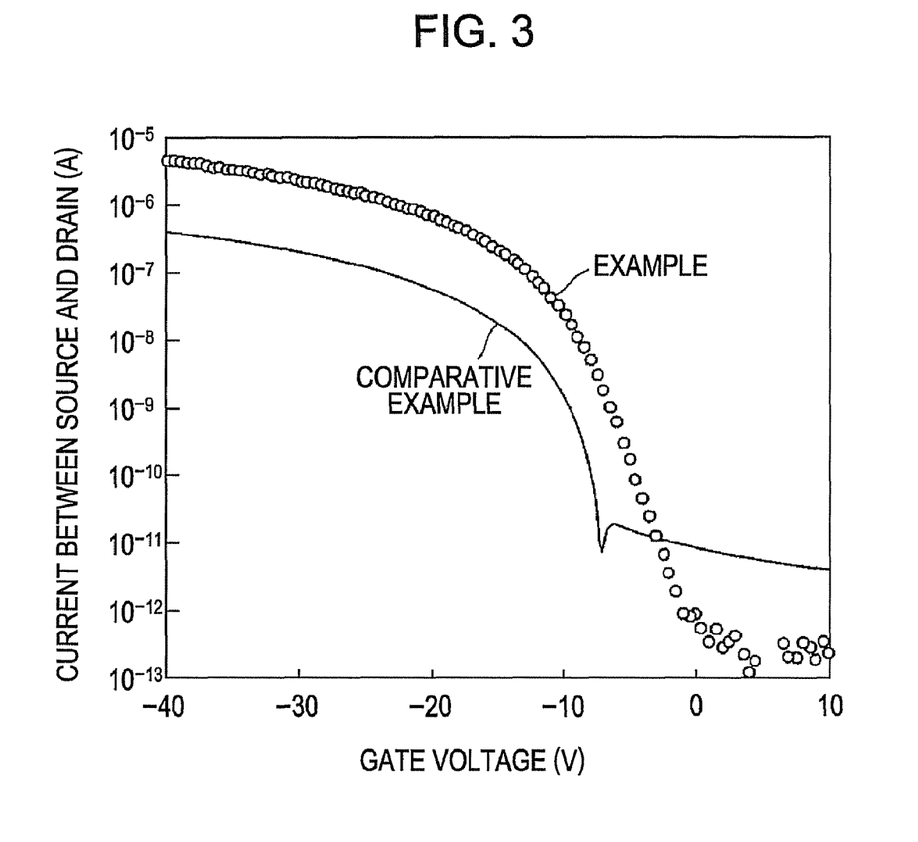
FIG. 3 is a plot of the electrical characteristics of an organic transistor according to an embodiment of the invention.

The characteristics of the organic transistor produced in the Example were measured with a semiconductor parameter analyzer (4156C produced by Agilent Technologies). More specifically, the drain current was measured when a drain voltage of −40 V was applied while the gate voltage was swept from +10 V to −40 V. The results are shown in FIG. 3. In the graph shown in FIG. 3, the horizontal axis represents the gate voltage and the vertical axis represents the current between the source and the drain electrode. The curve designated by small circles indicates the characteristics of the organic transistor of the Example. The curve designated by a solid line indicates the characteristics of the known organic transistor (comparative example) including a semiconductor layer having a uniform thickness formed by spin coating. The mobility, the threshold voltage ($V_{th}$) and the on/off ratio were obtained from FIG. 3 as described below, and the results are shown in the Table.

(1) Off Current

The current at a gate voltage of 0 was obtained from the relationship between the gate voltage and the drain current shown in FIG. 3.

(2) On/Off Ratio

It was obtained as a ratio of the drain current at a gate voltage of −40 V to the drain current at a gate voltage of 0 V.

(3) Mobility, Threshold Voltage

The threshold voltage was obtained as the y intercept of the line of a graph with a vertical axis representing the drain current to the one-half power and a horizontal axis representing the gate voltage. The mobility of the transistor was calculated from the gradient of the line in the saturated region.

TABLE

| | Mobility (cm$^2$/Vs) | Threshold voltage $V_{th}$ (V) | On/off ratio |
|---|---|---|---|
| Example | 8.2 × 10$^2$ | −7 | 1000000 |
| Comparative Example | 7.7 × 10$^3$ | −12 | 100000 |

The results shown above indicates that the organic transistor of the Example exhibited a dramatically superior threshold voltage and on/off ratio, confirming the effect of the invention.

Electronic Apparatus

Figure 4:
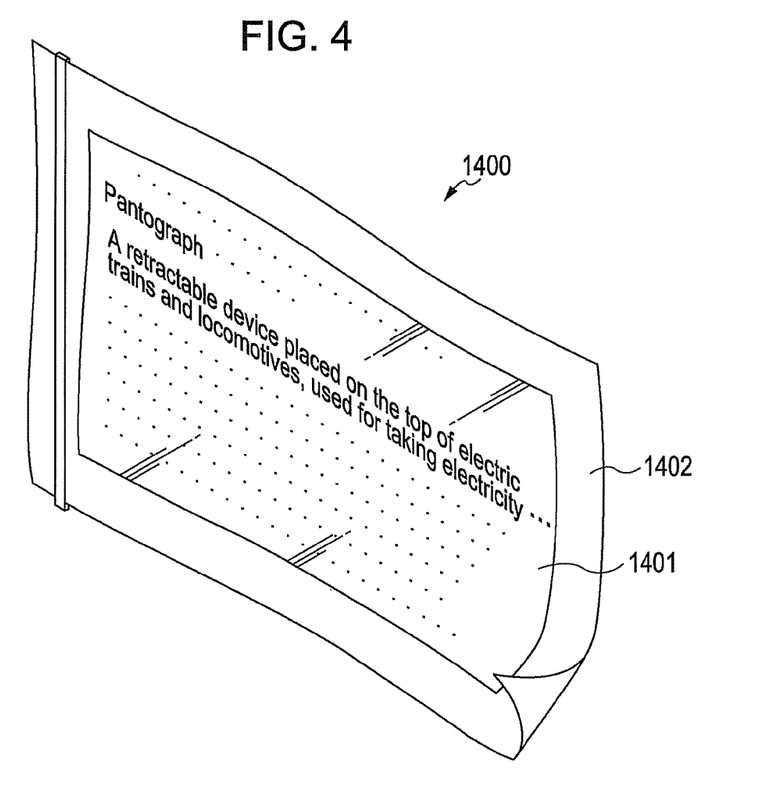
FIG. 4 is a schematic view of an electronic paper as an electronic apparatus according to an embodiment of the invention.

FIG. 4 is a schematic view of an electronic paper 1400 as an electronic apparatus according to an embodiment of the invention. The electronic paper 1400 includes a display portion 1401 including the organic transistors of the invention and a body 1402 made of a flexible sheet having the same texture as conventional paper. The organic transistor of the invention can be used in a variety of electronic apparatus as well as the electronic paper. Such electronic apparatuses include, for example, electronic books, personal computers, digital still cameras, liquid crystal TV sets, viewfinder-type or monitor-direct-view-type video tape recorders, car navigation systems, pagers, electronic notebooks, electronic calculators, word processors, work stations, videophones, POS terminals, and other apparatuses having a touch panel.

What is claimed is:

1. An organic transistor comprising:
a source electrode and a drain electrode;
an organic semiconductor layer disposed between the source electrode and the drain electrode;
a gate insulating layer; and
a gate electrode opposing the source and drain electrodes with the organic semiconductor layer and the gate insulating layer therebetween,
wherein the organic semiconductor layer includes a first semiconductor portion in a region where the gate electrode and the source electrode oppose each other, a second semiconductor portion in a region where the gate electrode and the drain electrode oppose each other, and a third semiconductor portion between the first semiconductor portion and the second semiconductor portion; and the first semiconductor portion, the second semiconductor portion, the third semiconductor portion, the source electrode, and the drain electrode satisfy the relationships of W1<W3, W2<W3, W4<W3, and W5<W3, wherein W1 represents the average thickness of the first semiconductor portion, W2 represents the average thickness of the second semiconductor portion, W3 represents the average thickness of the third semiconductor portion, W4 represents a height of an upper surface of the first semiconductor portion from a lower surface of the source electrode, and W5 represents a height of an upper surface of the second semiconductor portion from a lower surface of the drain electrode.

2. The organic transistor according to claim 1, wherein W1, W2, and W3 satisfy the relationships W1≦50 nm, W2≦50 nm, and 50 nm<W3≦200 nm.

3. The organic transistor according to claim 1, wherein only part of the source electrode opposes the gate electrode.

4. The organic transistor according to claim 1, wherein only part of the drain electrode opposes the gate electrode.

5. An electronic apparatus comprising the organic transistor as set forth in claim 1.

6. An organic transistor comprising:
a source electrode and a drain electrode;
an organic semiconductor layer disposed between the source electrode and the drain electrode;
a gate insulating layer; and
a gate electrode opposing the source and drain electrodes with the organic semiconductor layer and the gate insulating layer therebetween, wherein the organic semiconductor layer includes a first semiconductor portion in a region where the gate electrode and the source electrode oppose each other, a second semiconductor portion in a region where the gate electrode and the drain electrode oppose each other, and a third semiconductor portion between the first semiconductor portion and the second semiconductor portion;

wherein an average thickness of the first semiconductor portion is W1, an average thickness of the second semiconductor portion is W2, an average thickness of the third semiconductor portion is W3, a combined thickness of the first semiconductor portion and the source electrode is W4, a combined thickness of the second semiconductor portion and the drain electrode is W5, and each of W1, W2, W4, and W5 are less than W3.

7. The organic transistor according to claim 6, wherein W1, W2, and W3 satisfy the relationships W1≦50 nm, W2≦50 nm, and 50 nm<W3≦200 nm.

8. The organic transistor according to claim 6, wherein only part of the source electrode opposes the gate electrode.

9. The organic transistor according to claim 6, wherein only part of the drain electrode opposes the gate electrode.

10. An electronic apparatus comprising the organic transistor as set forth in claim 6.

* * * * *